(12) United States Patent
Wang et al.

(10) Patent No.: US 8,168,465 B2
(45) Date of Patent: May 1, 2012

(54) THREE-DIMENSIONAL SEMICONDUCTOR TEMPLATE FOR MAKING HIGH EFFICIENCY THIN-FILM SOLAR CELLS

(75) Inventors: David Xuan-Qi Wang, Fremont, CA (US); Mehrdad M. Moslehi, Los Altos, CA (US)

(73) Assignee: Solexel, Inc., Milpitas, CA (US)

( * ) Notice: Subject to any disclaimer, the term of this patent is extended or adjusted under 35 U.S.C. 154(b) by 54 days.

(21) Appl. No.: 12/618,649

(22) Filed: Nov. 13, 2009

(65) Prior Publication Data
US 2010/0148318 A1 Jun. 17, 2010

Related U.S. Application Data

(60) Provisional application No. 61/114,378, filed on Nov. 13, 2008.

(51) Int. Cl.
*H01L 31/18* (2006.01)
(52) U.S. Cl. ...... 438/73; 438/701; 438/753; 257/E31.04
(58) Field of Classification Search .............. 257/E31.04
See application file for complete search history.

(56) References Cited

U.S. PATENT DOCUMENTS

| | | |
|---|---|---|
| 4,043,894 A | 8/1977 | Gibbs |
| 4,070,206 A | 1/1978 | Kressel et al. |
| 4,082,570 A | 4/1978 | House et al. |
| 4,165,252 A | 8/1979 | Gibbs |
| 4,249,959 A | 2/1981 | Jebens |
| 4,251,679 A | 2/1981 | Zwan |
| 4,348,254 A | 9/1982 | Lindmayer |
| 4,361,950 A | 12/1982 | Amick |
| 4,409,423 A | 10/1983 | Holt |
| 4,427,839 A | 1/1984 | Hall |
| 4,461,922 A | 7/1984 | Gay et al. |
| 4,479,847 A | 10/1984 | McCaldin et al. |
| 4,626,613 A | 12/1986 | Wenham et al. |
| 4,672,023 A | 6/1987 | Leung |
| 4,922,277 A | 5/1990 | Carlson |
| 5,024,953 A | 6/1991 | Uematsu et al. |
| 5,073,230 A | 12/1991 | Maracas et al. |

(Continued)

FOREIGN PATENT DOCUMENTS

JP 06-260670 A 9/1994

(Continued)

OTHER PUBLICATIONS

Alvin D. Compaan, Photovoltaics: Clean Power for the 21st Century, Solar Energy Materials & Solar Cells, 2006, pp. 2170-2180, vol. 90, Elsevier B.V.

(Continued)

*Primary Examiner* — Stephen W Smoot
(74) *Attorney, Agent, or Firm* — Hulsey, P.C.; William N. Hulsey, III; John Ryan Cecil Wood

(57) ABSTRACT

A semiconductor template having a top surface aligned along a (100) crystallographic orientation plane and an inverted pyramidal cavity defined by a plurality of walls aligned along a (111) crystallographic orientation plane. A method for manufacturing a semiconductor template by selectively removing silicon material from a silicon template to form a top surface aligned along a (100) crystallographic plane of the silicon template and a plurality of walls defining an inverted pyramidal cavity each aligned along a (111) crystallographic plane of the silicon template.

5 Claims, 10 Drawing Sheets

U.S. PATENT DOCUMENTS

| | | |
|---|---|---|
| 5,112,453 A | 5/1992 | Behr et al. |
| 5,208,068 A | 5/1993 | Davis |
| 5,248,621 A | 9/1993 | Sano |
| 5,316,593 A | 5/1994 | Olson et al. |
| 5,348,618 A | 9/1994 | Canham et al. |
| 5,397,400 A | 3/1995 | Matsuno et al. |
| 5,459,099 A | 10/1995 | Hsu |
| 5,494,832 A | 2/1996 | Lehmann et al. |
| 5,538,564 A | 7/1996 | Kaschmitter |
| 5,645,684 A | 7/1997 | Keller |
| 5,660,680 A | 8/1997 | Keller |
| 5,681,392 A | 10/1997 | Swain |
| 5,882,988 A | 3/1999 | Haberern et al. |
| 5,928,438 A | 7/1999 | Salami |
| 6,091,021 A | 7/2000 | Ruby |
| 6,096,229 A | 8/2000 | Shahid |
| 6,114,046 A | 9/2000 | Hanoka |
| 6,127,623 A | 10/2000 | Nakamura et al. |
| 6,204,443 B1 | 3/2001 | Kiso et al. |
| 6,225,193 B1 | 5/2001 | Simpson et al. |
| 6,294,725 B1 | 9/2001 | Hirschberg et al. |
| 6,331,208 B1 | 12/2001 | Nishida et al. |
| 6,399,143 B1 | 6/2002 | Sun et al. |
| 6,416,647 B1 | 7/2002 | Dordi et al. |
| 6,429,037 B1 | 8/2002 | Wenham et al. |
| 6,441,297 B1 | 8/2002 | Keller et al. |
| 6,448,155 B1 | 9/2002 | Iwasaki et al. |
| 6,461,932 B1 | 10/2002 | Wang |
| 6,524,880 B2 | 2/2003 | Moon et al. |
| 6,534,336 B1 | 3/2003 | Iwane |
| 6,555,443 B1 | 4/2003 | Artmann et al. |
| 6,566,235 B2 | 5/2003 | Nishida et al. |
| 6,602,760 B2 | 8/2003 | Poortmans et al. |
| 6,602,767 B2 | 8/2003 | Nishida et al. |
| 6,613,148 B1 | 9/2003 | Rasmussen |
| 6,624,009 B1 | 9/2003 | Green et al. |
| 6,645,833 B2 | 11/2003 | Brendel |
| 6,649,485 B2 | 11/2003 | Solanki et al. |
| 6,653,722 B2 | 11/2003 | Blalock |
| 6,664,169 B1 | 12/2003 | Iwasaki et al. |
| 6,756,289 B1 | 6/2004 | Nakagawa et al. |
| 6,881,644 B2 | 4/2005 | Malik et al. |
| 6,946,052 B2 | 9/2005 | Yanagita et al. |
| 6,964,732 B2 | 11/2005 | Solanki |
| 7,022,585 B2 | 4/2006 | Solanki et al. |
| 7,026,237 B2 | 4/2006 | Lamb |
| 7,368,756 B2 | 5/2008 | Bruhns et al. |
| 7,402,523 B2 | 7/2008 | Nishimura |
| 2002/0153039 A1 | 10/2002 | Moon et al. |
| 2002/0168592 A1 | 11/2002 | Vezenov |
| 2002/0179140 A1 | 12/2002 | Toyomura |
| 2003/0017712 A1 | 1/2003 | Brendel |
| 2003/0039843 A1 | 2/2003 | Johnson |
| 2003/0124761 A1 | 7/2003 | Baert |
| 2004/0028875 A1 | 2/2004 | Van Rijn |
| 2004/0173790 A1 | 9/2004 | Yeo |
| 2004/0259335 A1 | 12/2004 | Narayanan |
| 2004/0265587 A1 | 12/2004 | Koyanagi |
| 2005/0160970 A1 | 7/2005 | Niira |
| 2005/0172998 A1 | 8/2005 | Gee et al. |
| 2005/0176164 A1 | 8/2005 | Gee et al. |
| 2005/0177343 A1 | 8/2005 | Nagae |
| 2005/0199279 A1 | 9/2005 | Yoshimine et al. |
| 2005/0272225 A1 | 12/2005 | Weber et al. |
| 2005/0274410 A1 | 12/2005 | Yuuki et al. |
| 2005/0281982 A1 | 12/2005 | Li |
| 2006/0021565 A1 | 2/2006 | Zahler et al. |
| 2006/0043495 A1 | 3/2006 | Uno |
| 2006/0054212 A1 | 3/2006 | Fraas et al. |
| 2006/0070884 A1 | 4/2006 | Momoi et al. |
| 2006/0105492 A1 | 5/2006 | Veres et al. |
| 2006/0196536 A1 | 9/2006 | Fujioka |
| 2006/0231031 A1 | 10/2006 | Dings et al. |
| 2006/0266916 A1 | 11/2006 | Miller et al. |
| 2006/0270179 A1* | 11/2006 | Yang .................... 438/401 |
| 2006/0283495 A1 | 12/2006 | Gibson |
| 2007/0077770 A1 | 4/2007 | Wang et al. |
| 2007/0082499 A1 | 4/2007 | Jung et al. |
| 2008/0047601 A1 | 2/2008 | Nag et al. |
| 2008/0128641 A1 | 6/2008 | Henley et al. |
| 2008/0157283 A1 | 7/2008 | Moslehi |
| 2008/0210294 A1 | 9/2008 | Moslehi |
| 2008/0264477 A1 | 10/2008 | Moslehi |
| 2008/0289684 A1 | 11/2008 | Moslehi |
| 2008/0295887 A1 | 12/2008 | Moslehi |
| 2009/0042320 A1 | 2/2009 | Wang et al. |
| 2009/0107545 A1 | 4/2009 | Moslehi |
| 2009/0301549 A1 | 12/2009 | Moslehi |
| 2010/0022074 A1 | 1/2010 | Wang et al. |
| 2010/0116316 A1 | 5/2010 | Moslehi et al. |

FOREIGN PATENT DOCUMENTS

| | | |
|---|---|---|
| JP | 2002-299661 A | 10/2002 |
| WO | WO 00/28116 A1 | 5/2000 |

OTHER PUBLICATIONS

C.Berge, 150-mm Layer Transfer for Monocrystalline Silicon Solar Cells, Solar Energy Materials & Solar Cells, 2006, pp. 3102-3107, vol. 90, Elsevier B.V.

C.Oules et al, Silicon on Insulator Structures Obtained by Epitaxial Growth of Silicon over Porous Silicon, Journal of the Electrochemical Society, Inc., 1992, p. 3595, vol. 139, No. 12, Meylan Cedex, France.

C.S.Solanki, et al, Porous Silicon Layer Transfer Processes for Solar Cells, Solar Energy Materials & Solar Cells, 2004, pp. 101-113, vol. 83, Elsevier B.V., Leuven, Belgium.

C.S.Solanki, et al, Self-Standing Porous Silicon Films by One-Step Anodizing, Journal of Electrochemical Society, 2004, pp. C307-C314, vol. 151, The Electrochemical Society, Inc., Leuven, Belgium.

F.Duerinckx, et al, Reorganized Porous Silicon Bragg Reflectors for Thin-Film Silicon Solar Cells, IEEE Electron Device Letters, Oct. 2006, vol. 27, No. 10.

Francois J. Henley, Layer-Transfer Quality Cleave Principles, SiGen, 2005, Jul. 8, pp. 1-6, The Silicon Genesis Corporation, San Jose, California.

H.J.Kim, et al, Large-Area Thin-Film Free-Standing Monocrystalline Si Solar cells by Layer Transfer, Leuven, Belgium, IEEE, 2006.

J.H.Werner et al, From Polycrystalline to Single Crystalline Silicon on Glass, Thin Solid Films, 2001, pp. 95-100, vol. 383, Issue 1-2, Elsevier Science B.V., Germany.

J.J. Schermer et al., Epitaxial Lift-Off for large area thin film III/V devices, phys. Stat. sol. (a) 202, No. 4, 501-508 (2005).

Jianhua Zhao, et al, A 19.8% Efficient Honeycomb Multicrystalline Silicon Solar Cell with Improved Light Trapping, IEEE Transactions on Electron Devices, 1999, vol. 46, No. 10.

K. Van Nieuwenhuysen et al., Progress in epitaxial deposition on low-cost substrates for thin-film crystalline silicon solar cells at IMEC, Journal of Crystal Growth, 2006, pp. 438-441, vol. 287, Elsevier B.V., Leuven, Belgium.

K.L. Chopra et al., Thin-Film Solar Cells: An Overview, Progress in Photovoltaics: Research and Applications, 2004, pp. 69-92, vol. 12, John Wiley & Sons, Ltd.

Lammert et al., The Interdigitated Back Contact Solar Cell: A Silicon Solar Cell for Use in Concentrated Sunlight, IEEE Transactions on Electron Devices, pp. 337-342.

MacDonald et al., "Design and Fabrication of Highly Topographic Nano-imprint Template for Dual Damascene Full 3-D Imprinting," Dept. of Chemical Eng., University of Texas at Austin, Oct. 24, 2005.

Martin A. Green, Consolidation of Thin-Film Photovoltaic Technology: The Coming Decade of Opportunity, Progress in Photovoltaics: Research and Applications, 2006, pp. 383-392, vol. 14, John Wiley & Sons, Ltd.

Martin A. Green, Silicon Photovoltaic Modules: A Brief History of the First 50 Years, Progress in Photovoltaics: Research and Applications, 2005, pp. 447-455, vol. 13, John Wiley & Sons, Ltd.

Nobuhiko Sato et al, Epitaxial Growth on Porous Si for a New Bond and Etchback Silicon-on-Insulator, Journal of Electrochemical Society, Sep. 1995, vol. 142, No. 9, The Electrochemical Society, Inc., Hiratsuka, Japan.

P.J.Verlinden, et al, Sliver® Solar Cells: A New Thin-Crystalline Silicon Photovoltaic Technology, Solar Energy Materials & Solar Cells, 2006, pp. 3422-3430, vol. 90, Elsevier B.V.

P.R. Hageman et al., Large Area, Thin Film Epitaxial Lift Off III/V Solar Cells, 25th PVSC, 1996, May 13-17, Washington D.C., IEEE.

Photovoltaic Technology Research Advisory Council, A Vision for Photovoltaic Technology, 2005, pp. 1-41, European Commision Publications Office.

Prometheus Institute, U.S. Solar Industry Year in Review: U.S. Solar Energy Industry Charging Ahead, (SEIA) The Solar Energy Industry Association, 2006.

R.Brendel, et al, Sol-Gel Coatings for Light Trapping in Crystalline Thin Film Silicon Solar Cells, Journal of Non-Crystalline Solids, 1997, pp. 391-394, vol. 218, Elsevier Science B.V., Germany.

Richard Auer et al, Simplified Transfer Process for High-Current Thin-Film Crystalline Si Solar Modules, 3rd World Conference on Photovoltaic Energy Conversion, May 11-18, 2003, Osaka, Japan.

Richard M. Swanson, A Vision for Crystalline Silicon Photovoltaics, Progress in Photovoltaics: Research and Applications, 2006, pp. 443-453, vol. 14, John Wiley & Sons, Ltd.

Rolf Brendel, A Novel Process for Ultrathin Monocrystalline Silicon Solar Cells on Glass, 14th European Photovolaic Solar Energy Conference, Jun. 30-Jul. 4, 1997, Barcelona, Spain.

Rolf Brendel, Review of Layer Transfer Processes for Cystalline Thin-Film Silicon Solar Cells, The Japan Journal of Applied Physics, 2001, pp. 4431-4439, vol. 40, Part 1, No. 7, The Japan Society of Applied Physics, Japan.

Rolf Brendel, Thin-Film Crystalline Silicone Mini-Modules Using Porous Si for Layer Transfer, Solar Energy, 2004, pp. 969-982, vol. 77, Elsevier Ltd., Germany.

S. Hegedus, Thin Film Solar Modules: The Low Cost, High Throughput and Versatile Alternative to Si Wafers, Progress in Photvoltaics: Research and Applications, 2006, pp. 393-411, vol. 14, John Wiley & Sons, Ltd.

Takao Yonehara, et al, Epitaxial Layer Transfer by Bond and Etch Back of Porous Si, Applied Physics Letter 64, Apr. 18, 1994, vol. 16, American Institute of Physics.

Toshiki Yagi, et al, Ray-Trace Simulation of Light Trapping in Silicon Solar Cell with Texture Structures, Solar Energy Materials & Solar Cells, 2006, pp. 2647-2656, vol. 90, Elsevier B.V.

* cited by examiner

THREE-DIMENSIONAL SEMICONDUCTOR TEMPLATE FOR MAKING HIGH EFFICIENCY THIN-FILM SOLAR CELLS

This application claims the benefit of provisional patent application 61/114,378 filed on Nov. 13, 2008, which is hereby incorporated by reference.

FIELD

This disclosure relates in general to the field of photovoltaics and solar cells, and more particularly to semiconductor templates and methods for making semiconductor templates for use in manufacturing three-dimensional thin-film solar cells.

DESCRIPTION OF THE RELATED ART

Current methods for manufacturing a three-dimensional thin-film solar cell (3-D TFSC) include forming a 3-Dimensional thin-film silicon substrate (3-D TFSS) using a silicon template. The template may comprise a plurality of posts and a plurality of trenches between said a plurality of posts. The 3-D TFSS may then be formed by forming a sacrificial layer on the template, subsequently depositing a semiconductor layer, selective etching the sacrificial layer and releasing the semiconductor layer from the template. More specifically, the said semiconductor layer is a self-supporting, free-standing three-dimensional (3D) epitaxial silicon thin film deposited on and released from a low-cost reusable crystalline silicon substrate template. The reusable silicon template may be reused to form the 3D film numerous times before being reconditioned or recycled. Select portions of the released 3-D TFSS are then doped with a first dopant, and other select portions are than doped with a second dopant. After surface passivation processes, emitter and base metallization regions are formed to complete the solar cell structure. FIG. 1A illustrates a partial view of a re-usable mono-crystalline silicon template with hexagonal-prism posts according to the U.S. Patent Pub. No. 2008/0264477A1. FIG. 1B illustrates a partial view of a 3D thin-film, hexagonal-honeycomb-prism substrate with rear/bottom base silicon layer after release from the reusable template according to the U.S. Patent Pub. No. 2008/0264477A1.

The above referenced three-dimensional thin film solar cell templates, substrates, and cells provide cost, performance, and mechanical strength advantages compared to traditional flat solar cells with a similar amount of silicon because 3-D TFSC have superior mechanical strength, better light trapping, and lower cell processing costs because of their self-aligned nature.

From a mechanical structure perspective, given a fixed amount of silicon structural material, a honeycomb 3-D TFSS may provide a desirable mechanical rigidity and strength. However, from the fabrication process perspective, the trenches among the neighboring hexagonal pillars on the template need to be filled by epitaxial silicon growth and the substrate formed by the filled layer needs to be released from the template. These processes are often costly and difficult. Design and process improvements need to be made in making the relatively high aspect ratios trenches, epitaxial filling of the trenches and releasing a TFSS from the trenches.

Additionally, known flat thin film solar cells often require surface texturing to reduce reflectance losses which requires a minimum film thickness of preferably tens of microns (e.g., >30 µm) to avoid texturing etch-induced punch-through pinholes. Also, flat thin-film silicon substrates may have reduced mean optical path length which reduces IR absorption and results in reduced cell quantum efficiency. And flat thin-film crystalline silicon substrates may have poor mechanical strength for cell and module processing needs. Micro cracking defects at substrate edges and pinholes defects within the substrate could cause cracking initiations and these cracks propagate easily along the crystallographic directions.

SUMMARY

Therefore a need has arisen for a template which provides fabrication process improvements and manufacturing costs reductions for forming a three-dimensional thin-film solar cell substrate (3-D TFSC substrate). In accordance with the disclosed subject matter, a three-dimensional semiconductor template is provided which substantially eliminates or reduces disadvantages and problems associated with previously developed silicon substrates.

According to one aspect of the disclosed subject matter, a three-dimensional (3-D) semiconductor template is provided having a top surface aligned along a (100) crystallographic orientation plane of the template and an inverted pyramidal cavity formed by walls each aligned along a (111) crystallographic orientation plane of the template. In one embodiment, the template is made of mono-crystalline silicon. In yet another embodiment, the template has a multiple inverted pyramidal cavities which may be arranged in arrays or in a staggered pattern along the template surface. Further, the inverted pyramidal cavities may be different sizes and pyramidal shapes.

Additionally, fabrication methods for forming a three-dimensional silicon template are provided. In one embodiment, silicon material is selectively removed to form walls aligned along a (111) crystallographic plane of the silicon template defining the inverted pyramidal cavity. The removal may be by anisotropic etching of the silicon template. The inverted pyramidal silicon template may be made by anisotropic silicon etching using a photolithographically defined hard masking layer, such as silicon dioxide.

Technical advantages of the disclosed subject matter include fabrication process improvements and manufacturing cost reductions by utilizing the (111) crystallographic orientation plane to make inverted pyramid cavities on the template. Further, the inverted pyramidal cavities provide increased mechanical rigidity to the 3-D TFSS that is made from the template.

A technical advantage of the simplified fabrication processes and higher gas-to-silicon conversion ratio of epitaxial growth provided when using a template having inverted pyramidal cavities is an inverted pyramidal cavity based 3-D TFSS provides improved mechanical rigidity and strength. The strength of the template may be adjusted according to the arrays and staggered patterns of inverted pyramidal cavities provided.

A technical advantage of the present disclosure is innovative solar cell designs and technologies based on the use of self-supporting, free-standing, three-dimensional (3D) silicon thin films. The 3-D TFSCs described may be made to be relatively rigid, semi-rigid, or flexible depending on the structural design parameters of the cell substrate. Given an equal amount of silicon usage, the 3-D TFSS disclosed provides advantages over substrates made of flat thin-film (TF) crystalline silicon such as the following:

(1) Three-dimensional thin-film solar cells disclosed do not require a minimum film thickness;

(2) Three-dimensional thin-film solar cells disclosed trap light extremely efficiently by virtue of their 3D nature;

(3) Three-dimensional thin-film solar cells disclosed are mechanically robust because of their unique 3D structure, providing enhanced mechanical strength and handle-ability.

Further technical advantages of the disclosed subject matter include: 1) the semiconductor templates consist of known crystallographic silicon planes, i.e., the (111) and (100) planes and the epitaxial silicon layer grown from these two silicon planes yields better quality than from DRIE etched silicon 3-D surfaces, and 2) the large cavity opening angle) (70.6° of the disclosed silicon template formed by the cavity sidewall (111) planes is much wider than that may be etched from using deep reactive ion etch (DRIE) silicon etch. Therefore, the porous silicon formation, epitaxial silicon growth, and releasing of 3-D TFSS are more practical and cost efficient than a DRIE etched template.

The disclosed subject matter, as well as additional novel features, will be apparent from the description provided herein. The intent of this summary is not to be a comprehensive description of the claimed subject matter, but rather to provide a short overview of some of the subject matter's functionality. Other systems, methods, features and advantages here provided will become apparent to one with skill in the art upon examination of the following FIGURES and detailed description. It is intended that all such additional systems, methods, features and advantages included within this description, be within the scope of the accompanying claims.

BRIEF DESCRIPTIONS OF THE DRAWINGS

For a more complete understanding of the disclosed subject matter and advantages thereof, reference is now made to the following description taken in conjunction with the accompanying drawings in which like reference numbers indicate like features and wherein.

Figure 4A:
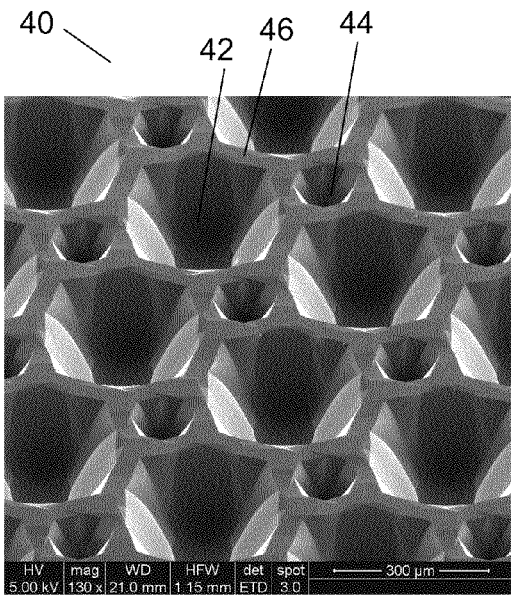
Figure 4B:
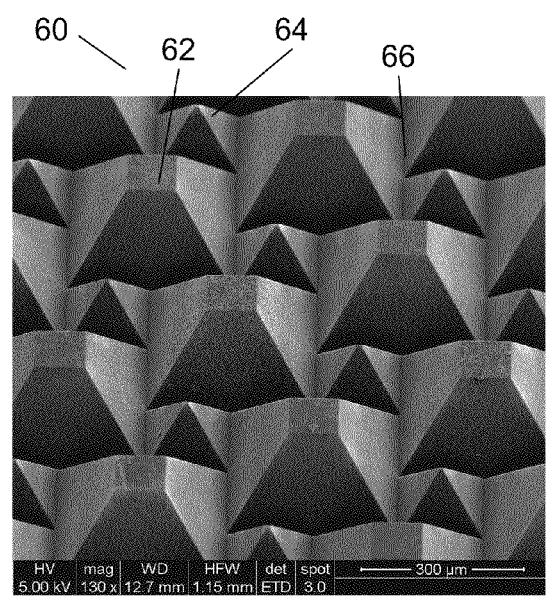
Figure 4C:
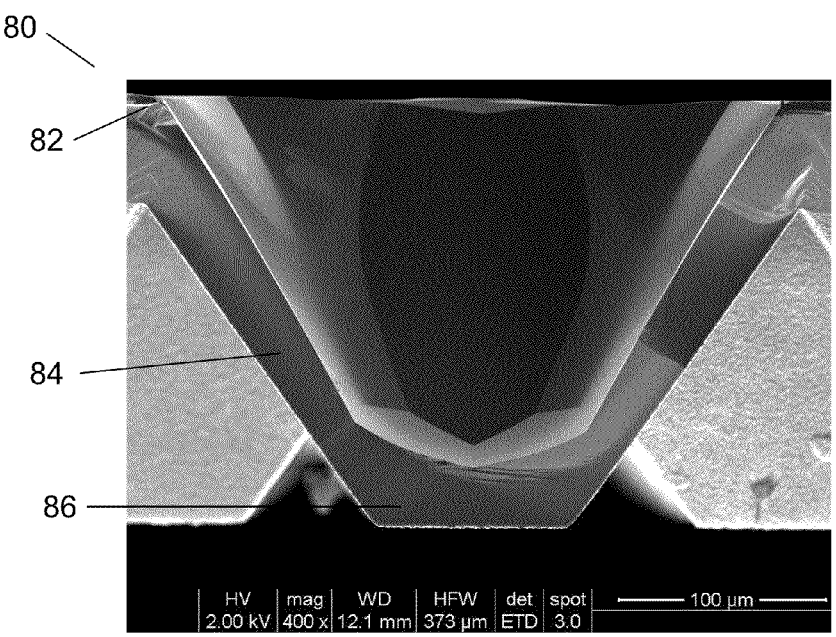
Figure 5:
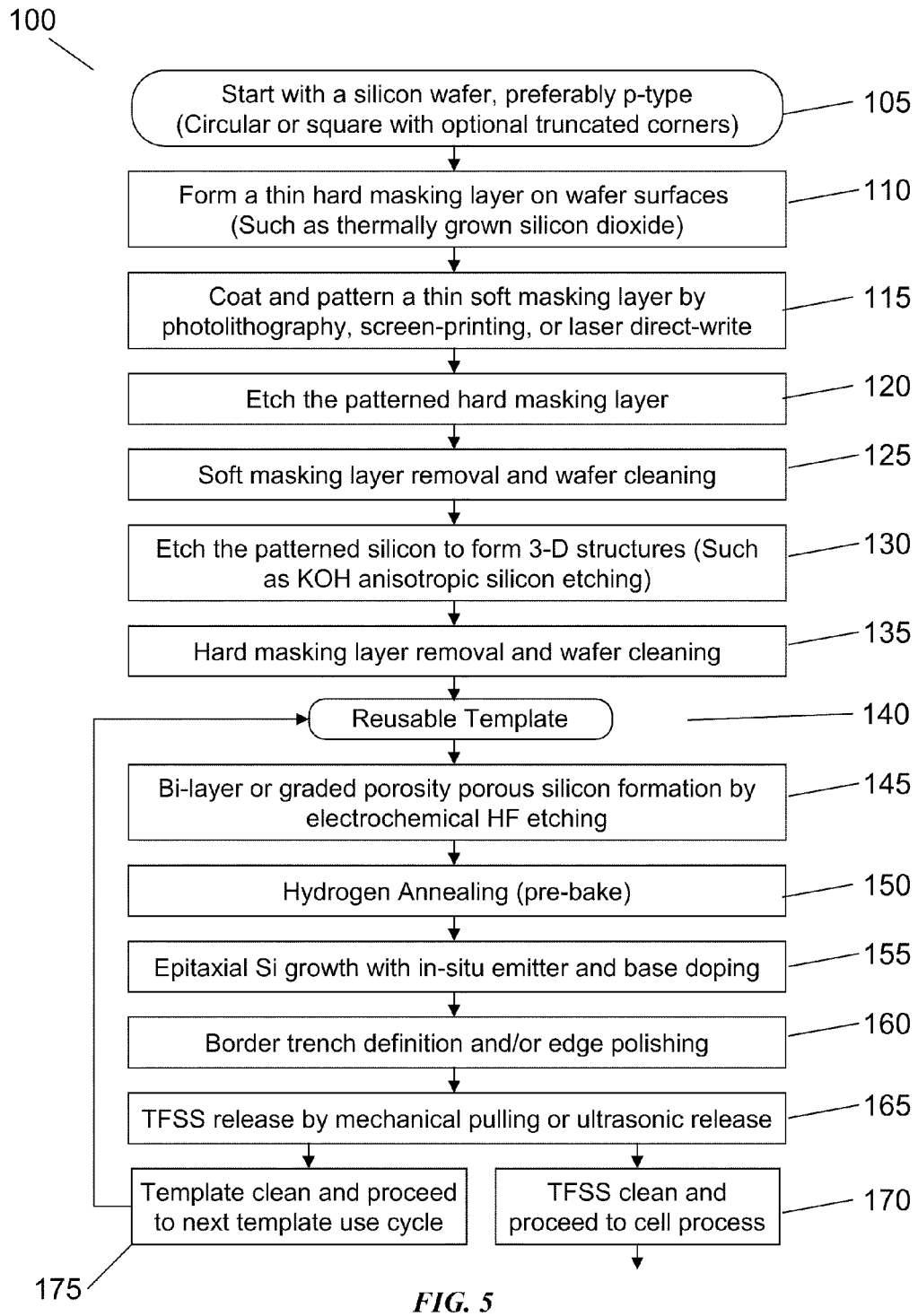
Figure 7:
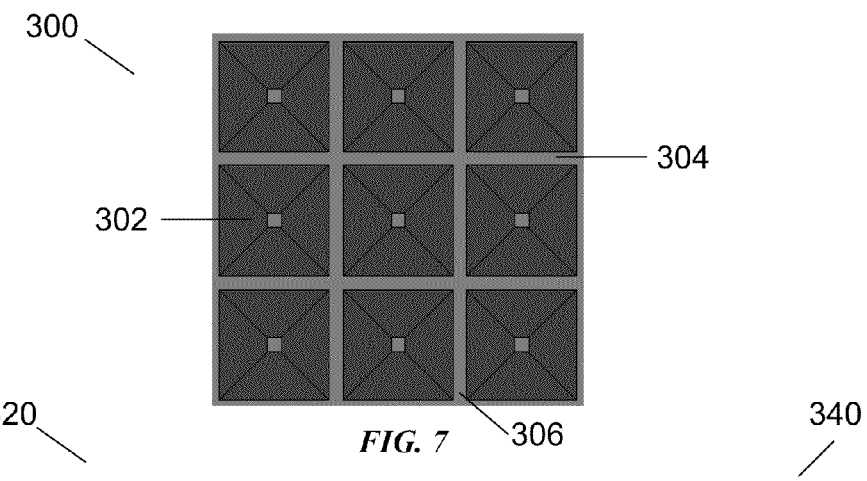
Figure 9:
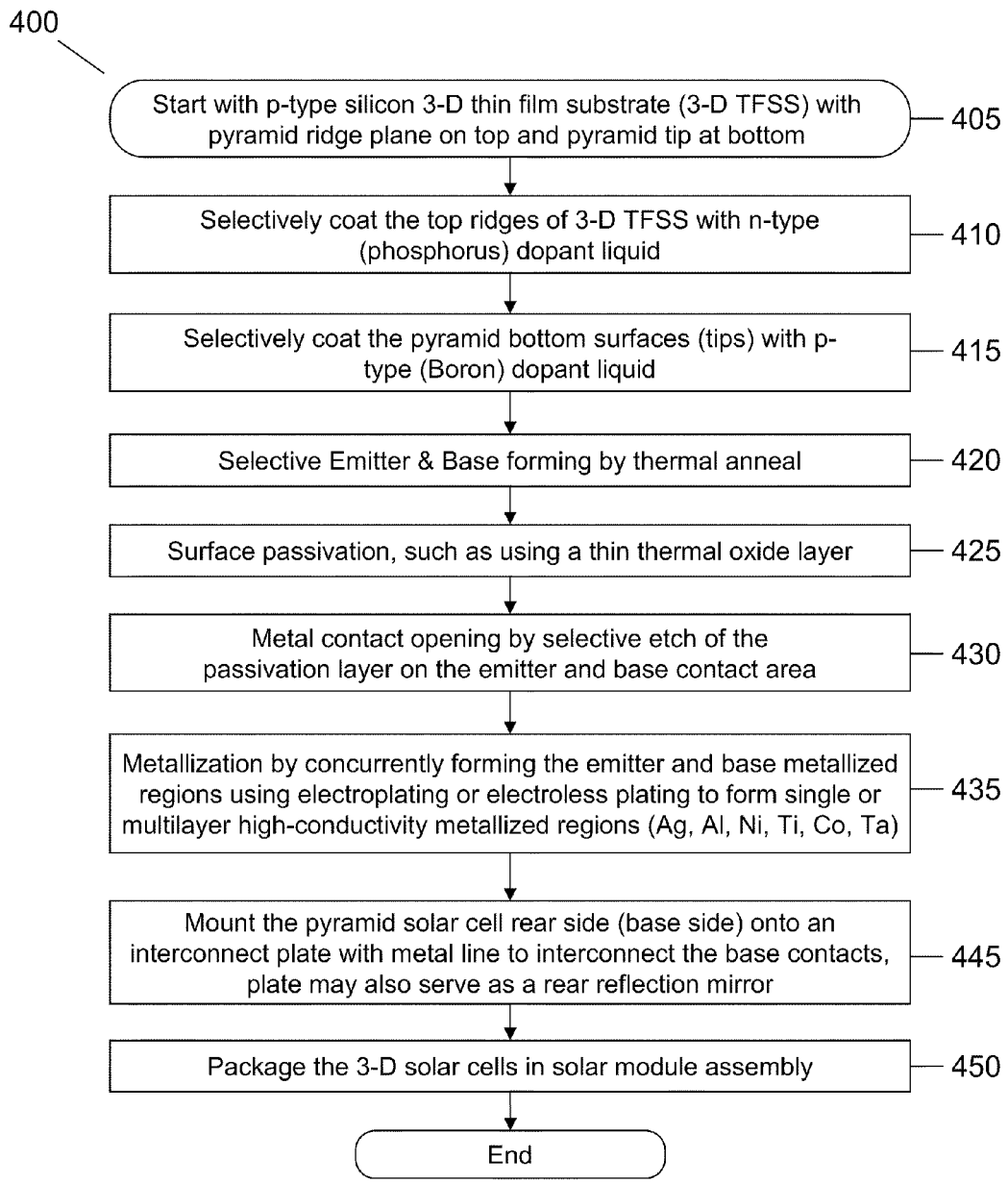

FIGS. 4A, 4B, and 4C are images of a fabricated three-dimensional thin-film silicon substrate;

FIG. 5 is a process flow depicting major fabrication process steps for manufacturing an inverted pyramidal silicon template and three-dimensional thin-film silicon substrate;

FIGS. 6A through 6G illustrates a process flow for manufacturing an inverted pyramidal silicon template and a three-dimensional thin-film silicon substrate;

FIG. 7 illustrates an array inverted pyramidal pattern on a semiconductor template;

FIGS. 8A through 8D illustrate alternative staggered inverted pyramidal layout patterns on a semiconductor template;

FIG. 9 is a process flow depicting major fabrication process steps for manufacturing a three-dimensional thin-film solar cell; and FIGS. 10A through 10D illustrate a process flow for manufacturing a three-dimensional thin-film solar cell.

DETAILED DESCRIPTION OF THE SPECIFIC EMBODIMENTS

The following description is not to be taken in a limiting sense, but is made for the purpose of describing the general principles of the present disclosure. The scope of the present disclosure should be determined with reference to the claims. Exemplary embodiments of the present disclosure are illustrated in the drawings, like numbers being used to refer to like and corresponding parts of the various drawings.

Figure 1A:
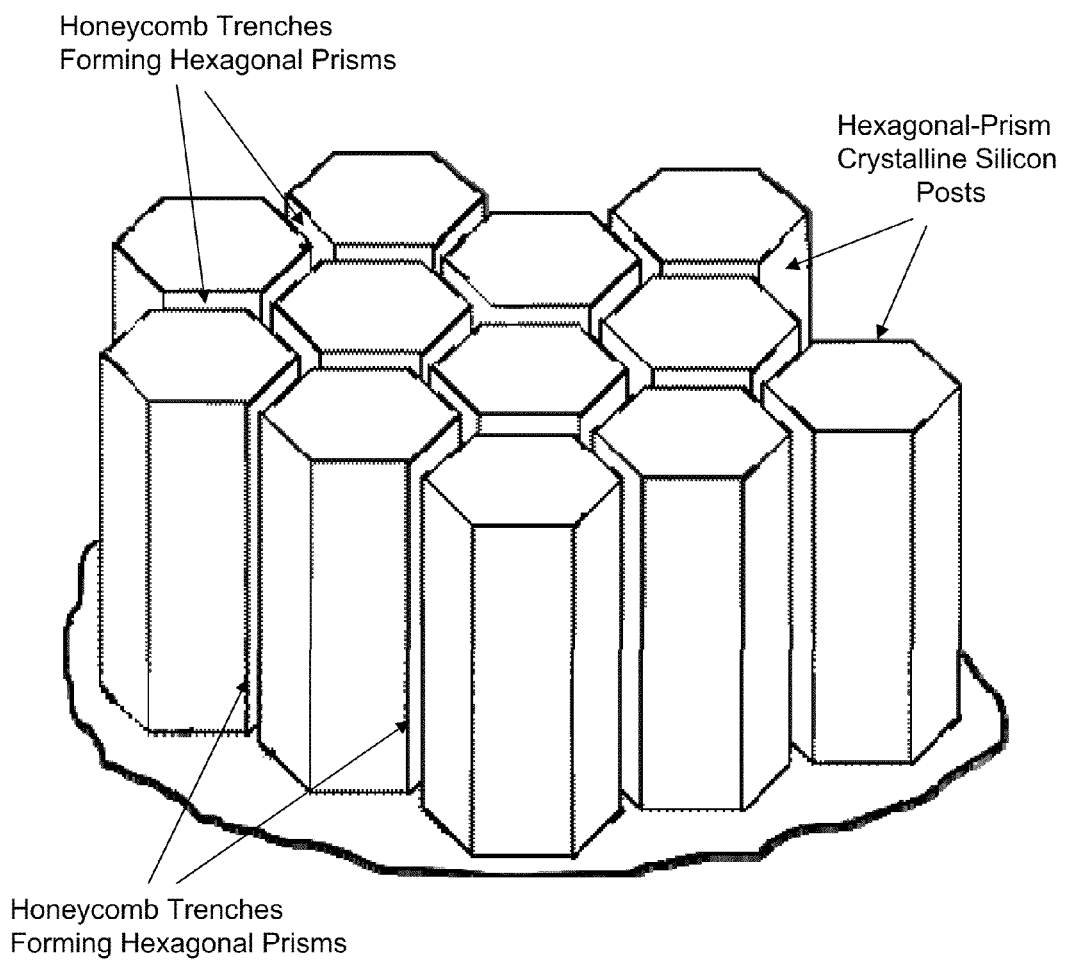
FIG. 1A (PRIOR ART) shows a prior art mono-crystalline silicon template.

FIG. 1A illustrates a partial view of a re-usable mono-crystalline silicon template with hexagonal-prism posts disclosed in U.S. Pat. Pub. No. 2008/0264477A1. The hexagonal pillars are etched by deep-reactive ion etching (DRIE) with photolithographically patterned photoresist as the hard masking layer. The DRIE etching provides well defined high-aspect ratio gaps between the pillars, however the narrow gaps are difficult to fill by the epitaxial silicon growth and it is difficult to release the epitaxial layer from such a template.

Figure 1B:
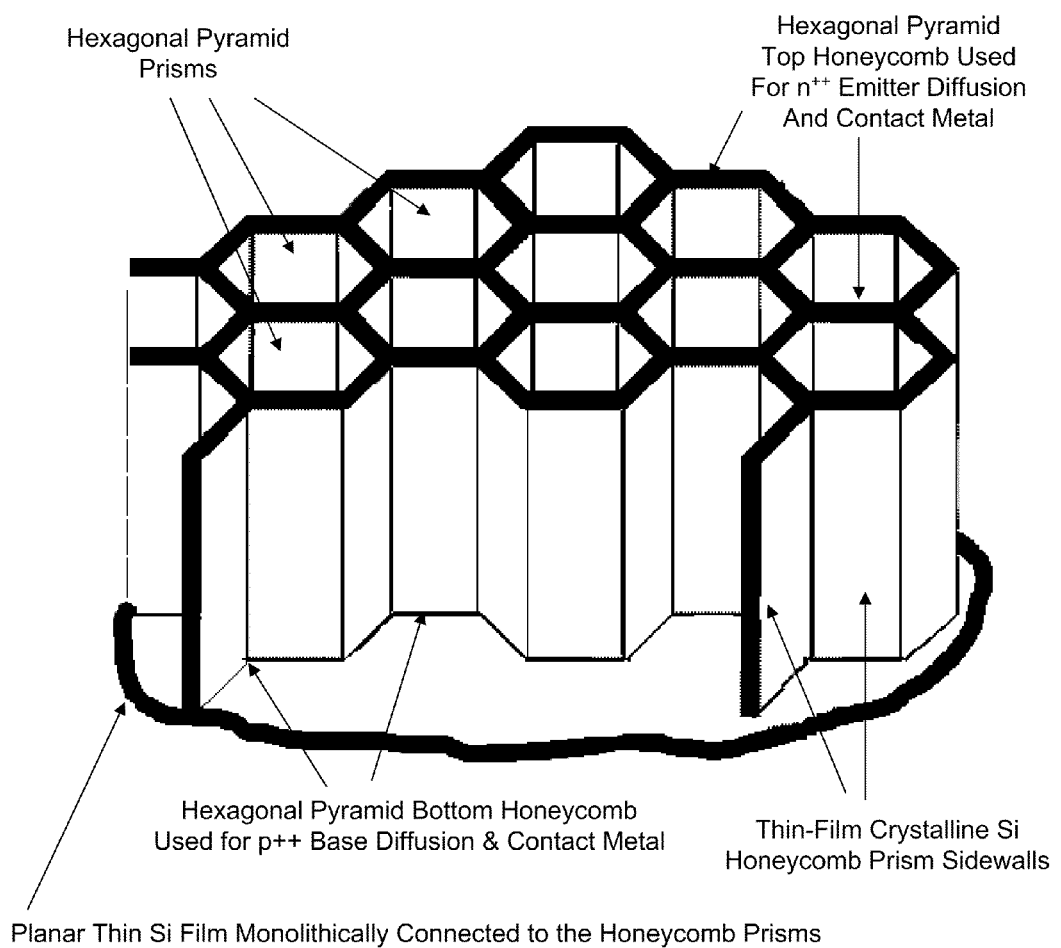
FIG. 1B (PRIOR ART) shows a prior art three-dimensional thin-film substrate after release from the template in FIG. 1A.

FIG. 1B illustrates a partial view of a 3D thin-film hexagonal-honeycomb-prism substrate with a rear/bottom base silicon layer after release from a reusable template disclosed in U.S. Pat. Pub. No. 2008/0264477A1.

Figure 2:
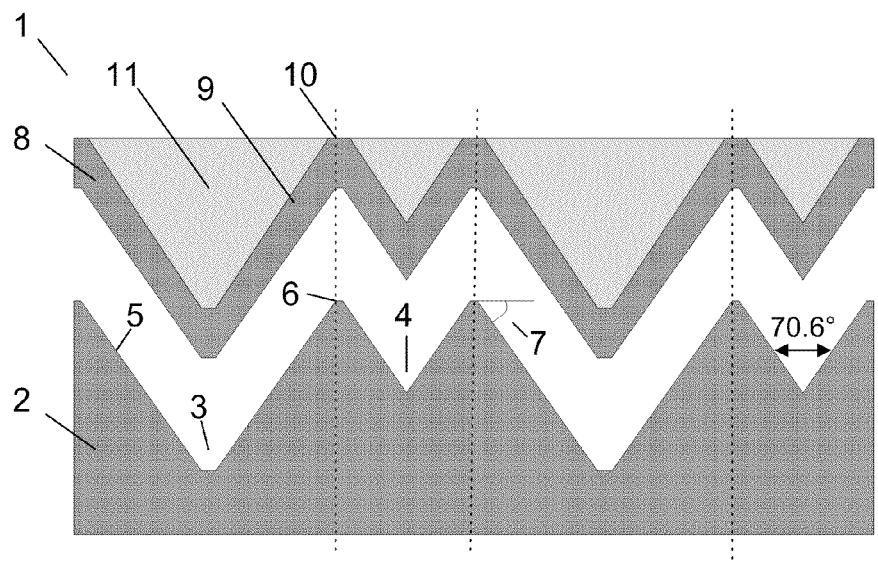
FIG. 2 illustrates a cross-sectional drawing of an inverted pyramidal template and a released corresponding three-dimensional thin-film silicon substrate.

FIG. 2 illustrates a cross-sectional drawing of an inverted pyramidal semiconductor template and a corresponding released three-dimensional thin-film semiconductor substrate. Inverted pyramidal template 2 is used to form corresponding released 3-D TFSS 8. As shown, the inverted pyramidal template consists of large inverted pyramidal cavities 3 and small inverted pyramidal cavities 4. Large inverted pyramidal cavity 3 and small inverted pyramidal cavity 4 which are defined by walls, such as wall 5 aligned along a (111) plane of inverted pyramidal template 2. Top surface 6 is aligned along a (100) plane of inverted pyramidal template 2. The inverted pyramid-shape cavities may be chemically etched by anisotropic silicon etchant and the angle between a sidewall (such as wall 5) and a top lateral plane (such as top surface 6), is about 54.7° (angle 7)—which is the defined angle between two (111) and (100) silicon crystallographic planes. Shown, small inverted pyramidal cavities 4 have an apex defined by walls aligned along the (111) crystallographic planes giving the apex, or tip, of the inverted pyramid an angle of 70.6°. Large inverted pyramidal cavities 3 have a flat apex, or flat tip, aligned along the (100) crystallographic plane. A semiconductor template of the disclosed subject matter may employ various apex styles dependent on shape of the 3-D TFSS desired.

Released 3-D TFSS 8 has a bottom surface profile conformal to the top of inverted pyramidal template 2. Wall 9 defines inverted pyramidal cavity 11 on released 3-D TFSS 8 and surface ridge 10 defines the base opening of inverted pyramidal cavity 11.

Figure 3:
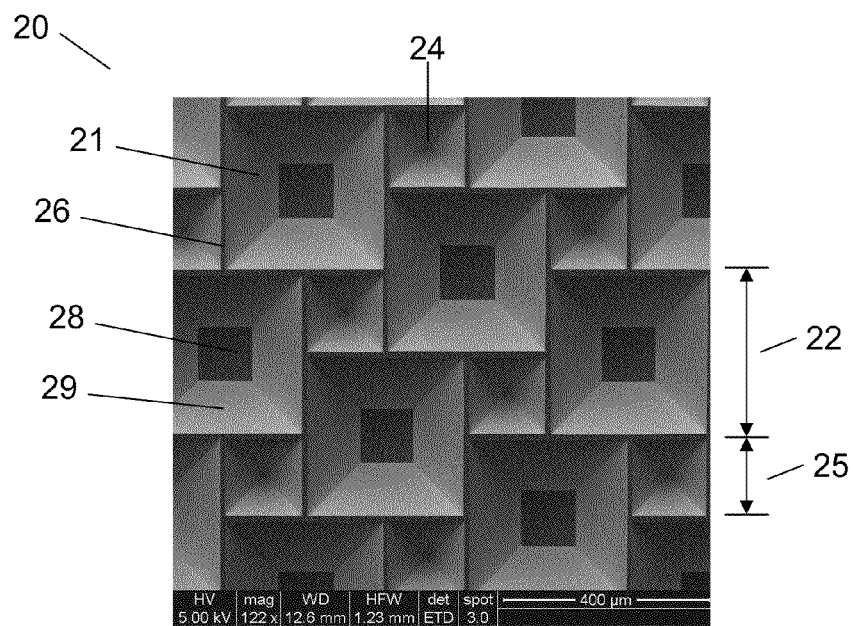
FIG. 3 is an image of a fabricated inverted pyramidal silicon template.

FIG. 3 presents a top Scanning Electron Microscope (SEM) partial view of a fabricated inverted pyramidal silicon template. Structured silicon template 20 consists of anisotropically etched large pyramid cavity 21 and small pyramid cavity 24. The top opening size 22 of the large cavities is in the range of 10 um to 1 mm and the top opening size 25 of the small cavities is a partial of 22. As shown the opening size of the large cavities, 22, is about 300 um and opening size of the small cavities, 25, is about 150 um. In this case, the depth of the small cavities is about 110 um and the depth of the large cavities is about 200 um. Top cavity surface 26 and bottom cavity surface 28 are aligned along (100) silicon crystallographic planes and sidewalls 29 of the cavities are aligned along (111) silicon crystallographic planes. Small pyramid cavity 24 has a pointed cavity apex/bottom which occurs at the intersection of four (111) sidewalls. Large pyramid cavity bottom 28 has a flat cavity bottom/apex the size of which may be in the range of 0 to 100 um. As shown, top cavity surface 26 is the ridge defining the opening between inverted pyramidal cavities. Top cavity surface 26 is preferably narrow and less than 10 um wide.

FIG. 4A presents a SEM partial view 40 of an embodiment of a fabricated three-dimensional thin-film silicon substrate from a tilted top perspective. The 3-D TFSS consists of a staggered pattern of large cavities, 42, and small cavities, 44. However due to the nature of the epitaxial silicon growth, crystallographic faceting occurs and results in a structure quite different from the inverted pyramidal cavities on the semiconductor template from which the 3-D TFSS was made in accordance with the disclosed subject matter. Further, ridge 46 between the cavities and defining a base opening of large cavity 42 is wider on its top side due to epitaxial overgrowth on the top surfaces aligned along the (100) crystallographic plane of a semiconductor template. The degree or amount of the shape change depends on the overall epitaxial silicon thickness. A thicker epitaxial thickness results in more shape change from the original silicon template structure from which 3-D TFSS was made. These shape and geometrical changes improve the mechanical strength of the 3-D TFSS and make the light trapping more effective.

FIG. 4B presents a SEM partial view 60 of an embodiment of a fabricated 3-D TFSS from a tilted bottom perspective. The shown 3-D TFSS backside is the reverse of the silicon template structure from which 3-D TFSS was made, which consisted of inverted pyramidal cavities forming large pyramid 62 and small pyramid 64 and ridges 66 defining the base openings of the inverted pyramidal cavities on the 3-D TFSS.

FIG. 4C presents a SEM partial view 80 of an embodiment of a fabricated 3-D TFSS from a cross-sectional perspective. Depending on the epitaxial growth process conditions, the thickness of the top ridge 82, sidewall 84 and bottom 86 may be different and could be purposefully tuned to achieve optimum mechanical, optical and electrical performances.

A 3-D TFSC fabrication process in accordance with the disclosed subject matter may comprise the following major steps:

(1) Template fabrication: 3-D inverted pyramidal patterns/structures are etched from a silicon wafer front surface and into the bulk silicon to form a silicon template. The structured silicon template is then used in the formation of a 3-D TFSS. The template may be capable of being used numerous times to fabricate numerous 3-D TFSS before being reconditioned or recycled. The template may be reused for as long as it remains relatively free of dislocations and/or for as long as it maintains an acceptable pyramid pattern having a pyramidal size and sidewall surface conditions within acceptable control limits (e.g. as gauged by in-line metrology);

(2) 3-D TFSS (substrate) fabrication: After forming low and high porosity porous silicon layers (or a graded porosity porous silicon layer) on the template front surface, epitaxial silicon is grown from the front template surface. In-situ emitter and base doping may be conducted during epitaxial silicon growth. The 3-D TFSS is then formed by releasing/separating the epitaxial silicon layer from the template. The released 3-D TFSS goes through subsequent solar cell processing steps and the template may be re-used after proper cleaning and optional reconditioning;

(3) Cell fabrication process: In the process module, the 3-D TFSS is optionally doped to form emitter and base regions if the doping is not conducted prior to the epitaxial layer release. Then a surface passivation layer and an antireflection layer are deposited, optional contact openings are formed, and metallization steps are conducted to form a 3-D TFSC; and (4) Module assembly and integration process: After proper testing and inspection, the fabricated 3-D TFSC may then optionally be mechanically reinforced, interconnected, encapsulated and mounted in the panels.

FIG. 5 is an embodiment of a process flow depicting major fabrication process steps for manufacturing an inverted pyramidal silicon template and three-dimensional thin-film silicon substrate. The silicon template making process starts with step 105 beginning with a mono-crystalline (100) silicon wafer. The starting wafer may be in circular or square shapes. Step 110 involves forming a thin hard masking layer on the exposed wafer surfaces. The hard masking layer is used to mask the silicon surface areas that do not need to be etched in the later steps—the surface areas that will become the top surface of the template. The proper hard masking layer includes, but is not limited to, thermally grown silicon oxide and low-pressure vapor phase deposited (LPCVD) silicon nitride. Step 115 involves a photolithography step, which consists of photoresist coating, baking, UV light exposure over a photomask, post baking, photoresist developing, wafer cleaning and drying. After this step, the pattern on the photomask depicting an array or a staggered pattern of inverted pyramidal base openings, will be transferred to the photoresist layer. The patterned photoresist layer is used as a soft masking layer for the hard masking layer etching of step 120. Step 120 involves further transferring the photoresist pattern to the hard masking layer layered underneath by chemical etching, such as etching a thin silicon oxide layer with buffered HF solution. Other wet etching methods and dry etching methods as known in semiconductor and MEMS wafer processing may also be used. In step 125 the remaining soft masking layer, i.e. the photoresist layer, is removed and the wafer is cleaned. Examples of photoresist removal process include wet methods, such as using acetone or piranha solution (a mixture of sulfuric acid and hydrogen peroxide), or dry methods such as oxygen plasma ashing. In step 130 the wafers are batch loaded in an anisotropic silicon wet etchant such as KOH solution. The typical etch temperature is in the range of 50° C. to 80° C. and etch rate is about 0.2 um/min to 1 um/min. TMAH (tetramethylammonium hydroxide) is an alternative anisotropic silicon etching chemical. The KOH or TMAH silicon etch rate depends upon the orientations to crystalline silicon planes. The (111) family of crystallographic planes are etched at a very slow rate and are normally "stop" planes for the anisotropic etching of a (100) silicon wafer with patterned hard mask. As a result, the intersection of two (111) planes or a (111) plane with a bottom (100) plane produce anisotropic etching structures for (100) silicon wafers after a time-controlled etch. Examples of these structures include V-grooves and pyramidal cavities with sharp tip cavity bottom (where (111) planes meet) or a small flat cavity bottom (a remaining (100) plane).

Advantages of the inverted pyramidal template of the present disclosure include: (i) the template KOH etching process is more convenient to control and has a low manufacturing cost compared to other silicon etching methods, such as RIE dry etching; (ii) the (111) plane dominant 3-D structure provides good porous silicon forming uniformity and epitaxial silicon quality due to the (111) plane sidewall smoothness and predictable and repeatable epitaxial growth rates; (iii) the dimensions, shape, and profiles of the inverted pyramidal structure on the template may be maintained conveniently and restored easily by a short KOH etching if needed after multiple template reuse cycles.

In step 135 of FIG. 5 the remaining hard masking layer is removed, by HF solution in the case the hard masking layer is silicon dioxide. Next, the wafer may be cleaned in standard SC1 (mixture of $NH_4OH$ and $H_2O_2$) and SC2 (mixture of HCL and $H_2O_2$) wafer wet cleaning solutions followed by a thorough deionized wafer rinsing and hot $N_2$ drying. The disclosed process results in a silicon template with inverted pyramidal cavities.

Step 140 of FIG. 5 marks the beginning of a silicon template re-use cycle. In step 145, a porous silicon layer is formed by electrochemical HF etching on the silicon template front surfaces. The porous silicon layer is to be used as a sacrificial layer for epitaxial silicon layer release. The porous silicon layer preferably consists of two thin layers with different porosities. The first thin porous silicon layer is a top layer and is formed first from the bulk silicon wafer. The first thin layer preferably has a lower porosity of 10%~35%. The second thin porous silicon layer is directly grown from the bulk silicon and is underneath the first thin layer of porous silicon. The $2^{nd}$ thin porous silicon layer preferably has a higher porosity in the range of 40%~80%. The top porous silicon layer is used as a crystalline seed layer for high quality epitaxial silicon growth and the bottom underneath higher porosity porous silicon layer is used for facilitating TFSS release due to its less dense physical connections between the epitaxial and bulk silicon interfaces and its weak mechanical strength. Alternatively, a single porous silicon layer with a progressively increased or graded porosity from top to bottom may also be used. In this case, the top portion of the porous silicon layer has a low porosity of 10% to 35% and the lower portion of the porous silicon layer has a high porosity of 40% to 80%. In step 150, before the epitaxial silicon growth, the wafer may be baked in a high temperature (at 950° C. to 1150° C.) hydrogen environment within the epitaxial silicon deposition reactor in order to form coalesced structures with relatively large voids within the higher-porosity porous silicon layer (or portion of a single layer) while forming a continuous surface seed layer of crystalline silicon on the lower-porosity porous silicon layer (or portion of a single layer). In step 155, a mono-crystalline silicon epitaxial layer is deposited on the front side only. The bulk base of the epitaxial layer is p-type, boron ($B_2H_6$) doped. The thickness of the epitaxial layer is preferably in the range of 5 um to 60 um. In step 160, prior to the release of the epitaxial silicon layer, an encompassing border trench may be made on the peripheral of the active wafer area to facilitate the release of the TFSS. The encompassing trenches may be formed by controlled laser cutting and their depths are preferably in the range of 5 um to 100 um. The trenches define the boundary of the 3-D TFSS to be released and allow initiation of the release from the trenched region. The remaining epitaxial silicon layer may be removed by mechanical grinding or polishing of the template edges. In step 165, the epitaxial layer of silicon is released and separated from the silicon template. The released epitaxial silicon layer is referred to as a 3-D thin film silicon substrate (3-D TFSS). The epitaxial layer release methods disclosed in U.S. patent application Ser. No. 12/473,811 entitled, SUBSTRATE RELEASE METHODS AND APPARATUS are hereby incorporated by reference. The 3-D TFSS may be released in an ultrasonic DI-water bath. Or in another release method, the 3-D TFSS may be released by direct pulling with wafer backside and top epitaxial vacuum chucked. In another release method, the epitaxial layer is released by direct pulling with wafer backside and top epitaxial vacuum chucked. Using this method the porous silicon layer may be fully or partially fractured. The chucks may use either electrostatic or vacuum chucking to secure the wafer. The wafer is first placed on bottom wafer chuck with TFSS substrate facing upwards. A bottom chuck secures the template side of wafer, and the top wafer chuck is gently lowered and secures TFSS substrate side of the wafer. The activated pulling mechanism lifts top chuck upwards, and the movement may be guided evenly by slider rails.

In step 170, the released 3-D TFSS backside surface is cleaned by short silicon etching using KOH or TMAH solutions to remove the silicon debris and fully or partially remove the quasi-mono-crystalline silicon (QMS) layer. After removal of the epitaxial silicon layer from the template, the template is cleaned in step 175 by using diluted HF and diluted wet silicon etch solution, such as TMAH and/or KOH to remove the remaining porous silicon layers and silicon particles. Then the template is further cleaned by conventional silicon wafer cleaning methods, such as SC1 and SC2 wet cleaning to removal possible organic and metallic contaminations. Finally, after proper rinsing with DI water and $N_2$ drying, the template is ready for another re-use cycle.

FIGS. 6A through 6D depict cross-sectional drawings illustrating a process flow for manufacturing an inverted pyramidal silicon template.

Figure 6A:
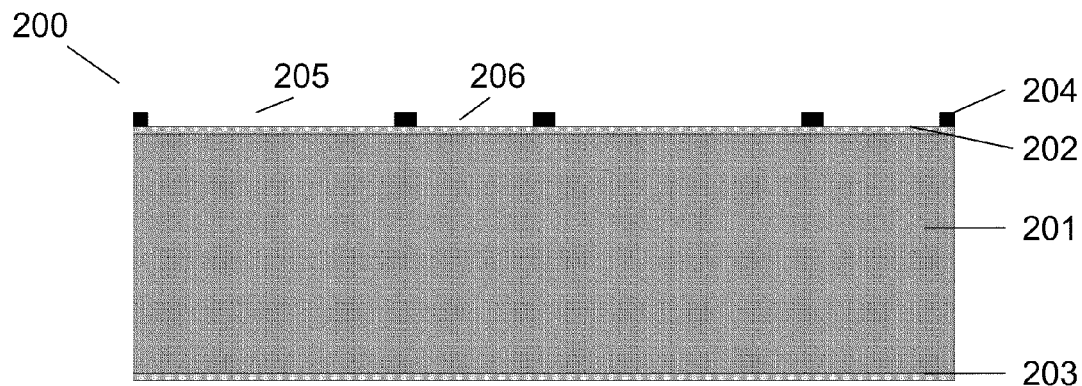

FIG. 6A illustrates mono-crystalline (100) silicon wafer 201 after a hard mask deposition and soft mask patterning. The thickness of silicon wafer 201 is in the range of 0.5 mm to 2 mm. The disclosed template forming process may be applied to a polished or non-polished surface. Alternatively, silicon wafers with square or quasi-square shapes may also be used. Front hard mask layer 202 and backside hard mask layer 203 are thermally grown silicon oxide layers having a thickness in the range of 0.5 um to 1.5 um. The oxide on the wafer edge is not shown. Photolithographic defined or screen-printed photoresist pattern 204 is applied on the front wafer surface. The photolithography process includes photoresist coating, baking, exposure, developing and post baking. The photoresist pattern consists of staggered pattern of large inverted pyramidal base opening 205 and small inverted pyramidal base opening 206. However, the photoresist pattern may also be an array of equally sized inverted pyramidal base openings. The inverted pyramidal base opening patterns should be precisely aligned to the wafer <100> direction on the front surface.

Figure 6B:
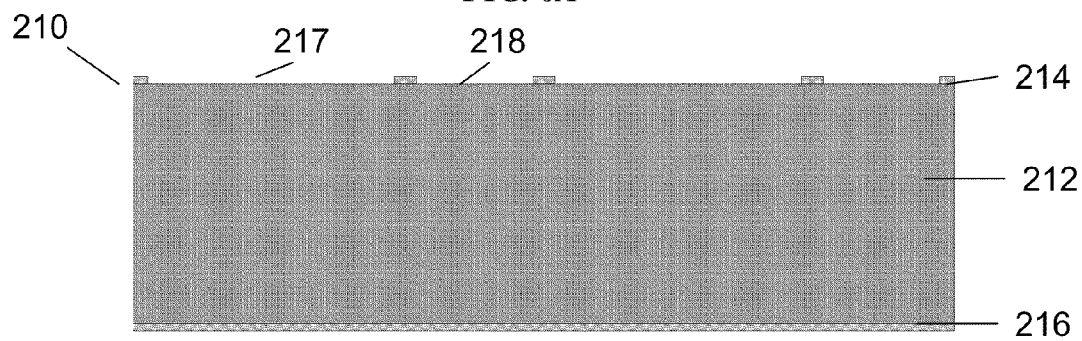

FIG. 6B illustrates wafer 212 after the inverted pyramidal base opening pattern is transferred to the hard masking layer, front oxide layer 214. The pattern transferring from the photoresist layer to the oxide layer is achieved by controlled oxide etching in a buffered HF solution. During HF wet etching, backside and edge oxide layer 216 is protected and keeps an original thickness. The oxide pattern on the front side of wafer 212 then consists of a staggered pattern of large inverted pyramidal base opening 217 and small inverted pyramidal base opening 218 that are aligned to the <100> crystallographic directions on the front lateral plane. After the pattern transfer, the remaining photoresist layer is removed by wet or dry photoresist removal methods. Therefore, the photoresist layer is not shown in FIG. 6B.

Figure 6C:
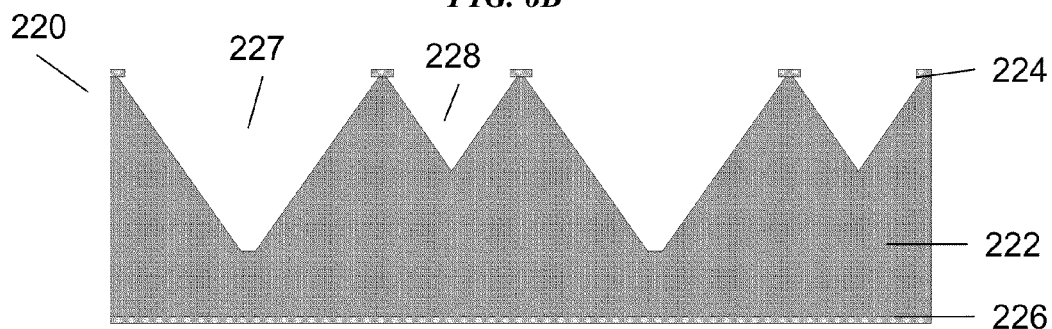

FIG. 6C illustrates wafer 220 after a silicon anisotropic etching step. Large inverted pyramidal cavity 227 and small inverted pyramidal cavity 228 are formed after a timed-controlled silicon etch in a KOH or TMAH solution. The etching temperature is preferably in the range of 50° C. to 80° C. During the silicon etching, the wafer backside and edge surfaces are fully protected by un-patterned oxide layer 226. The KOH etch may be timely controlled so that a certain inverted pyramidal cavity depth may be reached. Alternatively, the KOH etching may be self-terminated when the (111) walls forming the inverted pyramidal cavity meet at the cavity bottom/apex. After the KOH etching, remaining oxide layers 224 and 226 are thinner than before the etching because the oxide is also etched in the KOH or TMAH solution, but with a much slower etch rate than the silicon etch.

Figure 6D:
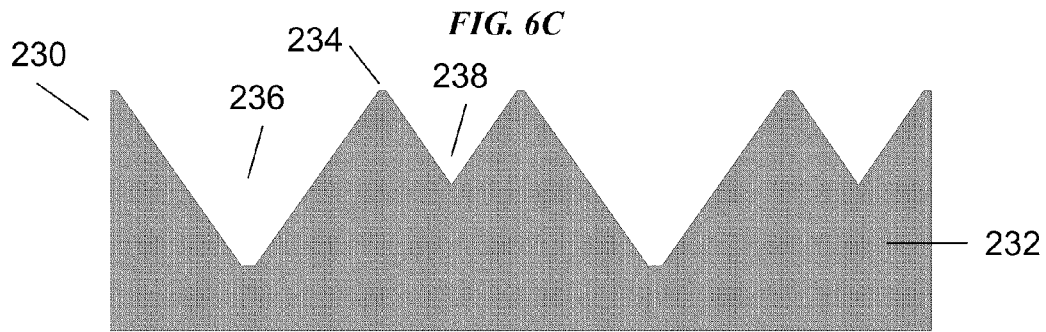

FIG. 6D illustrates inverted pyramidal silicon template 232 after removing the remaining oxide layer in a diluted HF solution followed by standard wafer cleaning in SC2 and SC2, DI water rinsing, and $N_2$ drying. The width of the ridges forming the base openings of the inverted pyramidal cavities, 234 is in the range of 0 to 20 um. The template now comprises a staggered pattern made of large inverted pyramidal cavity 236 and an adjacent small inverted pyramidal cavity 238. The angle between the cavity sidewalls and top surface ridges aligned along the (100) crystallographic plane, the lateral plane, is 54.7°.

Figure 6E:
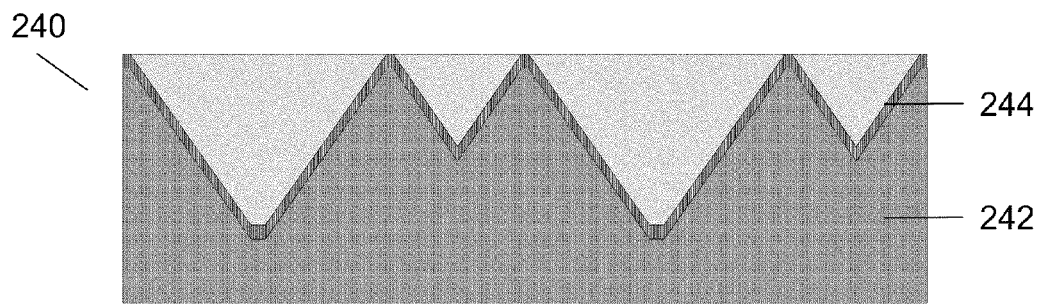
Figure 6F:
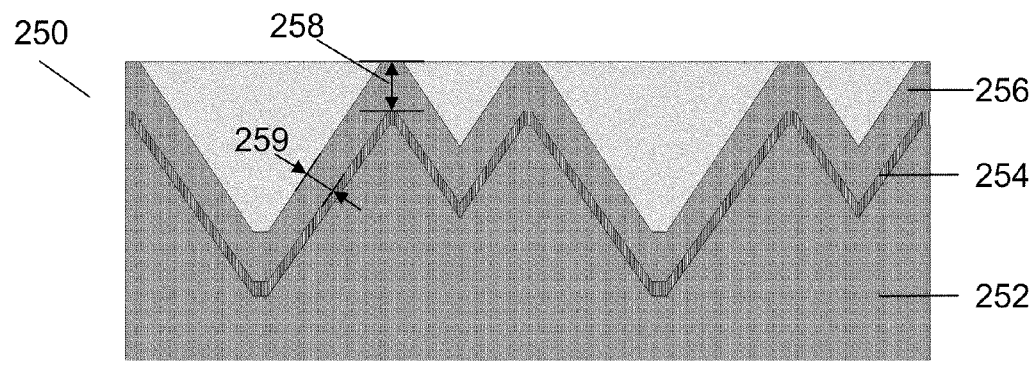
Figure 6G:

FIGS. 6E through 6G depict cross-sectional drawings illustrating a process flow for manufacturing a 3-D TFSS using an inverted pyramidal silicon template.

As shown is FIG. 6E, porous silicon layer 244 is formed by electrochemical HF etching on the front surface of silicon template 242. The porous silicon is used as a sacrificial layer and may consist of two thin layers with different porosities. The first thin porous silicon layer is on the top and is formed first from silicon wafer 242. The first thin layer preferably has a lower porosity of 10%~35%. The second thin porous silicon layer is formed directly from silicon wafer 242 and is underneath the first thin layer of porous silicon. The second thin porous silicon layer preferably has a higher porosity in the range of 40%~80%. The lower porosity porous silicon layer on top is used as a crystalline seed layer for high quality epitaxial silicon growth and the underneath higher porosity porous silicon layer is used for facilitating TFSS releasing due to its less density physical connections between the epitaxial and bulk silicon interfaces and its weak mechanical strength. Alternatively, a single porosity release layer with a progressively increased or graded porosity from top to bottom may also be used. In this case, the top portion of the porous silicon layer has a low porosity of 10% to 35% and the lower portion of the porous silicon layer has a high porosity of 40% to 80%.

FIG. 6F illustrates silicon template 252 after a thin layer of epitaxial silicon layer growth. In a batch process, after short hydrogen annealing in a temperature range of 950° C. to 1150° C., mono-crystalline silicon epitaxial layer 256 is deposited on porous silicon layer 254 located on the front side of silicon template 252. Mono-crystalline silicon epitaxial layer 256 may p-type, boron ($B_2H_6$) doped during the growth. The thickness of the epitaxial layer is preferably in the range of 5 um to 60 um. It is known that crystallographic orientation is one of the factors that affect the epitaxial growth rate. In the presence of a (100) and a (111) plane on the template, the epitaxial growth rate on the (100) plane is faster than on the (111) plane. The growth rate difference could be as large as 20%. Since the template ridge top surface is a (100) plane and the pyramid cavity sidewalls are (111) planes, the epitaxial silicon layer thickness at the top ridge region 258 is generally thicker than the sidewall regions 259. In addition, since the template top ridge surfaces are more exposed to the gas flow than the wall surfaces defining the inverted pyramidal cavities during the epitaxial growth process, the top portions (forming the base openings of the inverted pyramidal cavities) of the epitaxial layer of the pyramid structure are thicker than the bottom portions (forming the walls defining the inverted pyramidal cavities). This gas transportation limited growth rate differential could be enhanced by tuning gas pressures, flow rates, chamber sizes, and other physical parameters of the epitaxial process. Furthermore, the higher epitaxial growth rates at top portions of the pyramid cavities also generate faceting around the ridge areas. The faceting effect may changes the square opening patterns into polygon opening patterns as shown in FIG. 4A. The combined thickness increases (overgrowth) and shape changes generate a unique structure that resembles a prism-grid structure. As a result, the 3-D TFSS of the present disclosure provides the following unique features:

(1) The thickness increase and resulting polygon shape formed on the top surface of a 3-D TFSS provides significant enhancement to its mechanical rigidity and strength. The template top ridges correspond to the V-grooves of 3-D TFSS when viewed from the backside. When a 3-D TFSS is under a bending load, the V-groove areas have higher stress concentration than the sidewall areas. The increased thickness and the polygon shape at the top portion therefore enhance the mechanical handle-ability of the 3-D TFSS;

(2) The polygon shape and the faceting at its edges and corners provide better light-trapping effects than a square shaped pyramid structure;

(3) After a certain amount of epitaxial growth from the pyramid template, the top surface profile at the ridges may be sharpener than the original template ridge surface profile. The top surface ridge sharpening effect may increase the optical trapping and/or electrical efficiencies; and (4) After the epitaxial growth from the pyramid template, the TFSS surfaces are made of crystallographic planes. When the top surface of the epitaxial layer (before or after the 3-D TFSS release) is exposed to a diluted anisotropic etchant, such as KOH, for a short time, the top surfaces can be further sharpened to increase the optical and electrical efficiencies of the resulting solar cells. Thus, the disclosed subject matter takes advantage of the higher etch rates of convex crystallographic edges than concave edges in anisotropic silicon etching.

FIG. 6G illustrates 3-D TFSS 264 that is released from silicon template 262. Prior to the release, an encompassing border trench, not shown in the figure, may be made on the peripheral of the active wafer area to facilitate the release. The encompassing trenches are formed by controlled laser cutting and their depths are preferably in the range of 5 um to 100 um. The trenches define the boundary of the 3-D TFSS to be released and allow initiation of the release from the trenched region. Alternatively, the thin epitaxial layer on the template edge could be removed first by mechanical grinding and then defining the shape of the 3-D TFSS by laser trimming after it has been released from the template. The released epitaxial layer, referred to as 3-D TFSS 264 is physically separate from silicon template 262. The epitaxial layer release methods disclosed in U.S. patent application Ser. No. 12/473,811 entitled, SUBSTRATE RELEASE METHODS AND APPARATUS are hereby incorporated by reference. The epitaxial layer may be released in an ultrasonic DI-water bath. In another release method, the epitaxial layer is released by direct pulling with wafer backside and top epitaxial vacuum chucked. Using this method the porous silicon layer may be fully or partially fractured. The chucks may use either electrostatic or vacuum chucking to secure the wafer. The wafer is first placed on bottom wafer chuck with TFSS substrate facing upwards. A bottom chuck secures the template side of wafer, and the top wafer chuck is gently lowered and secures TFSS substrate side of the wafer. The activated pulling mechanism lifts top chuck upwards, and the movement may be guided evenly by slider rails.

After removal of the epitaxial silicon layer from the template, the template is cleaned by using diluted HF and diluted wet silicon etch solution, such as TMAH and/or KOH to remove the remaining porous silicon layers and silicon particles. The template may then be further cleaned by conventional silicon wafer cleaning methods, such as SC1 and/or SC2 wet cleaning to removal possible organic and metallic contaminations. Finally, after proper rinsing with DI water and drying, the template is ready for another re-use cycle. Next, the released TFSS backside surface is cleaned by short silicon etching using KOH or TMAH solutions to remove the silicon debris and fully or partially remove the QMS layer.

One of the key factors in the template structural design is the use of inverted pyramidal cavity structures instead of non-inverted pyramidal pillar structures. In the present disclosure, the corners/edges where (111) planes meet are "concave". In other words, the (111) planes form the sidewalls of pyramidal cavities. In comparison, there have been reported "convex" cases, where the (111) planes form the sidewalls of pyramidal pillars. An inverted-pyramid cavity structure with "concave" corners is preferable over a non-inverted pyramid pillar structure with "convex" corners because of the following reasons:

(1) The silicon anisotropic etching of inverted-pyramidal cavities self-terminates when two (111) plane meet, while in the non-inverted-pyramid pillars case, the etching continues with higher etch rate at the convex edges where two (111) planes meet. Therefore, from the manufacturability perspective, the former case is preferred because of its convenient process control;

(2) Because inverted pyramidal cavities have only (111) planes for sidewall and (100) planes for top surface, an epitaxial growth from these crystallographic surfaces have better geometry and process control than the non-inverted-pyramidal pillar case;

(3) Because the inverted pyramidal cavities consist of concave (111) plane intersections, the silicon template can be conveniently cleaned and re-conditioned in a short time by anisotropic etching after each re-use cycle or once every several reuse cycles.

The mechanical handle-ability of the 3-D TFSS is another key factor in the template structure design.

FIG. 7 illustrates a template having an array, or non-staggered, pattern inverted pyramidal cavities. Pyramidal cavities 302 all have the same base opening size and thus the same cavity depth, and are arranged in an array. Ridges 304 form lateral rows and columns between the inverted pyramidal cavities. These ridges may be referred to as frames, grids, space lines, or ridge lines. Ridges 304 are aligned to the (100) crystallographic direction of the template. The straight long ridges between the cavities on the template will be transferred to the backside of a corresponding 3-D TFSS made in accordance with the disclosed subject matter in long V-groove shapes. The V-grooves on the 3-D TFSS are aligned to the (100) crystallographic directions. Thus when the 3-D TFSS experiences in-plane or out-of-plane bending or twisting, stress concentration and bending moment on the long V-grooves are higher than the inverted pyramidal cavity sidewalls. Therefore, the V-grooves behave like an out-of-plane bending/rotation axis, resulting in a very flexible substrate. Additionally, because the V-grooves are aligned in the <100> direction, once a micro fracturing is initiated from either the edge or the middle of the 3-D TFSS, it propagates easily along the V-grooves and causes the TFSS to crack. As a result, an advantage of this type of TFSS is mechanical flexibility and a disadvantage is that the TFSS is relatively weak. Therefore one of the key factors in making TFSS with reliable mechanical rigidity and strength is to avoid long and straight ridges, shown as ridges 304, on the template.

FIG. 8A through 8D illustrate four examples of template layout patterns of staggered inverted pyramidal cavity designs. An advantage of one embodiment of the present disclosure to increase the mechanical strength of a 3-D TFSS through staggered patterns of inverted pyramidal cavities. Staggered patterns avoid long V-groove on the 3-D TFSS because staggered patterns limit the length of the ridges forming the base openings of the inverted pyramidal cavities (in both rows and columns as shown form a top view of the template). The staggered pattern designs of the present disclosure are not limited to the described embodiments but instead include any staggered pattern of inverted pyramidal cavities.

Figure 8A:
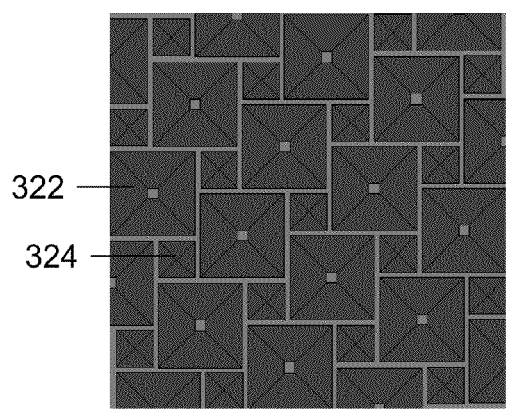

FIG. 8A shows a staggered inverted pyramidal cavity layout pattern that consists of two cavity sizes. Small cavity 324 has a base opening half the size of the base opening of large cavity 322. In this case, the V-groove length on the corresponding 3-D TFSS will be about 1.5 times as long as the length of one side of the base opening of large cavity 322. Additionally, each ridge on template 320 and each V-groove on the formed 3-D TFSS is intersected at twice (each at one third the length of the ridge or V-groove) by neighboring perpendicular ridges or V-grooves. As a result, the intersection of V-grooves of a 3-D TFSS made with this staggered pattern are uniformly spread giving this staggered pattern good mechanical handle-ability and uniform mechanical strength across its lateral plane.

Figure 8B:
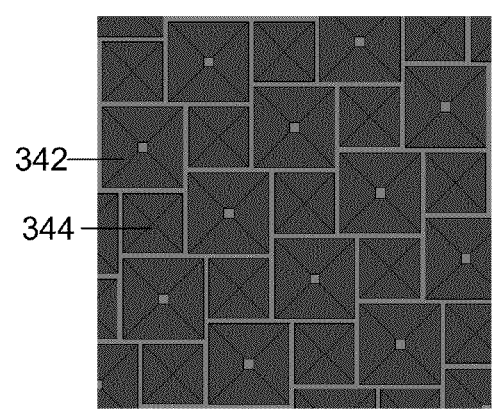

FIG. 8B presents another alternative staggered inverted pyramidal cavity layout pattern that consists of two cavity sizes. Small cavity 344 has a base opening that is a fraction of the base opening of large cavity 342. Shown, the ratio between the two cavity sizes is between 1 and 2. This cavity layout pattern is a general pattern of the layout shown in FIG. 8A. In this design, the V-groove length on the formed 3-D TFSS is about 1 to 2 times of the cavity length. Furthermore, alternatively the inverted pyramidal cavity layouts may include different inverted pyramidal cavity shapes (such as rectangular) and staggered inverted pyramidal cavities with more than two sizes.

Figure 8C:
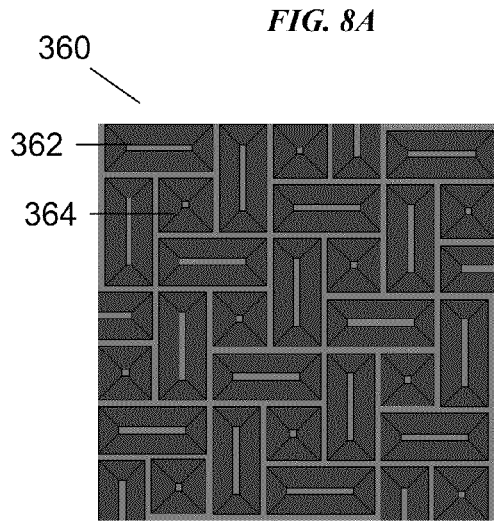

FIG. 8C presents an alternative staggered inverted pyramidal cavity layout that consists of rectangular cavity 362 and square cavity 364. Square cavity 364 has a base opening size equal to the width of the base opening of rectangular cavity 362. Each square cavity is surrounded by two pairs of perpendicularly arranged rectangular cavities. Thus, the length of the V-grooves on the formed 3-D TFSS will be about the length of the base opening of rectangular cavity 362 plus twice the width of rectangular cavity 362.

Figure 8D:
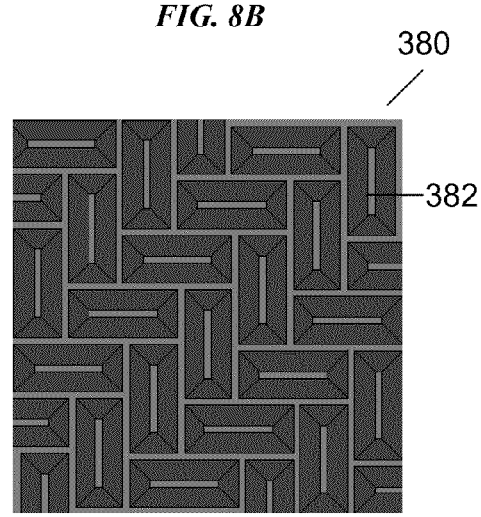

FIG. 8D presents yet another alternative staggered inverted pyramidal cavity layout that consists of one size of inverted pyramidal cavities. Each rectangular cavity 382 has the same size and is arranged in a staggered perpendicular format. In this case, the length of the V-grooves on the 3-D TFSS will be about the length of the base opening of rectangular cavity 382 plus the width of rectangular cavity 382 on the template.

FIG. 9 is a process flow depicting major fabrication process steps of an exemplary method for making a 3-D TFSC using the released 3-D TFSS, in a block diagram 400. The 3-D TFSC fabrication process starts in Step 405 with a p-type silicon 3-D thin film substrate (3-D TFSS) having inverted pyramidal ridges on a top surface plane and inverted pyramidal apex regions on a bottom surface. Step 410 involves selectively coating the top ridge areas of the 3-D TFSS with an n-type (such as phosphorus) liquid dopant. Viewed from a top perspective, the coated areas form long lines that are connected at cell edges to form fingers and busbars patterns as in regular flat silicon based solar cells. However, the doped fingers and busbar lines on the top ridge areas may not be straight lines if the inverted pyramidal cavity pattern layout is staggered. The selective liquid dopant coating may be done by aligned screen printing, roller coating, or direct inkjet dispense. After the coating, the coated layer is dried and cured (e.g., by thermal curing at 250° C. to 400° C. or UV irradiation). Step 415 involves selectively coating the bottom side of the 3-D TFSS with p-type (such as boron) liquid dopant. The liquid dopant is selectively coated to the inverted pyramidal apex regions on the bottom surface of the 3-D TFSS by aligned or self-aligned roller coating, screen printing, or dip-coating methods. After the coating, the coated layer is dried and cured (e.g., by thermal curing at 250° C. to 400° C. or UV irradiation). Step 420 involves forming n++ selective emitter and p++ base diffusion contact regions by thermal annealing that may be done in a diffusion furnace at 800° C. to 950° C., where the emitter and base are concurrently formed. Step 425 involves a surface passivation process. In one embodiment, a thermal oxide layer of 10 to 200 nanometers is grown at 800° C. to 950° C. In another embodiment, PECVD silicon nitride thin layer could also be used as a surface passivation layer. The surface passivation layers are applied on both the top and bottom surfaces of the 3-D TFSS. Step 430 involves making local openings on the emitter and base contact regions by selective passivation layer chemical etching, such as by applying HF-based etchant by inkjet dispensing. The contact openings are made smaller than the dopant diffused areas to avoid shunting after metallization. Step 435 involves self-aligned metallization. The emitter and base metallized regions are concurrently formed using selective electroplating and/or electroless plating to form single or multilayer high-conductivity metallized regions of silver, aluminum, nickel, titanium, cobalt, or tantalum. For instance, the plated metal stack may include a thin (50 to 500 nanometers) barrier and adhesion layer (made of nickel) followed by a relatively thick (2 to 15 microns) layer of high-conductivity metal (silver, copper, or aluminum). In another embodiment, the metal contacts may be formed by the aligned inkjet dispense or screen printing of metal particles, such as silver nano-particles in a liquid solution or paste. Step 445 involves mounting the 3-D thin film solar cell (3-D TFSC) onto a plate with a metal surface or metal lines to interconnect the base contacts. The metal plate preferably has a reflective surface to serve as a rear reflection mirror. The mounting could direct metal-to-metal fusion or with a highly conductive adhesive. Step 450 involves packaging the fabricated solar cell into a solar module assembly. In this manufacturing module, the emitter and base metal contacts are interconnected among the solar cells to form the power output connections of a solar panel.

FIG. 10A through 10D illustrate partial cross-sectional views of a process flow for manufacturing a three-dimensional thin-film solar cell according to the process steps of FIG. 9.

Figures 10A, 10B, 10C, 10D:
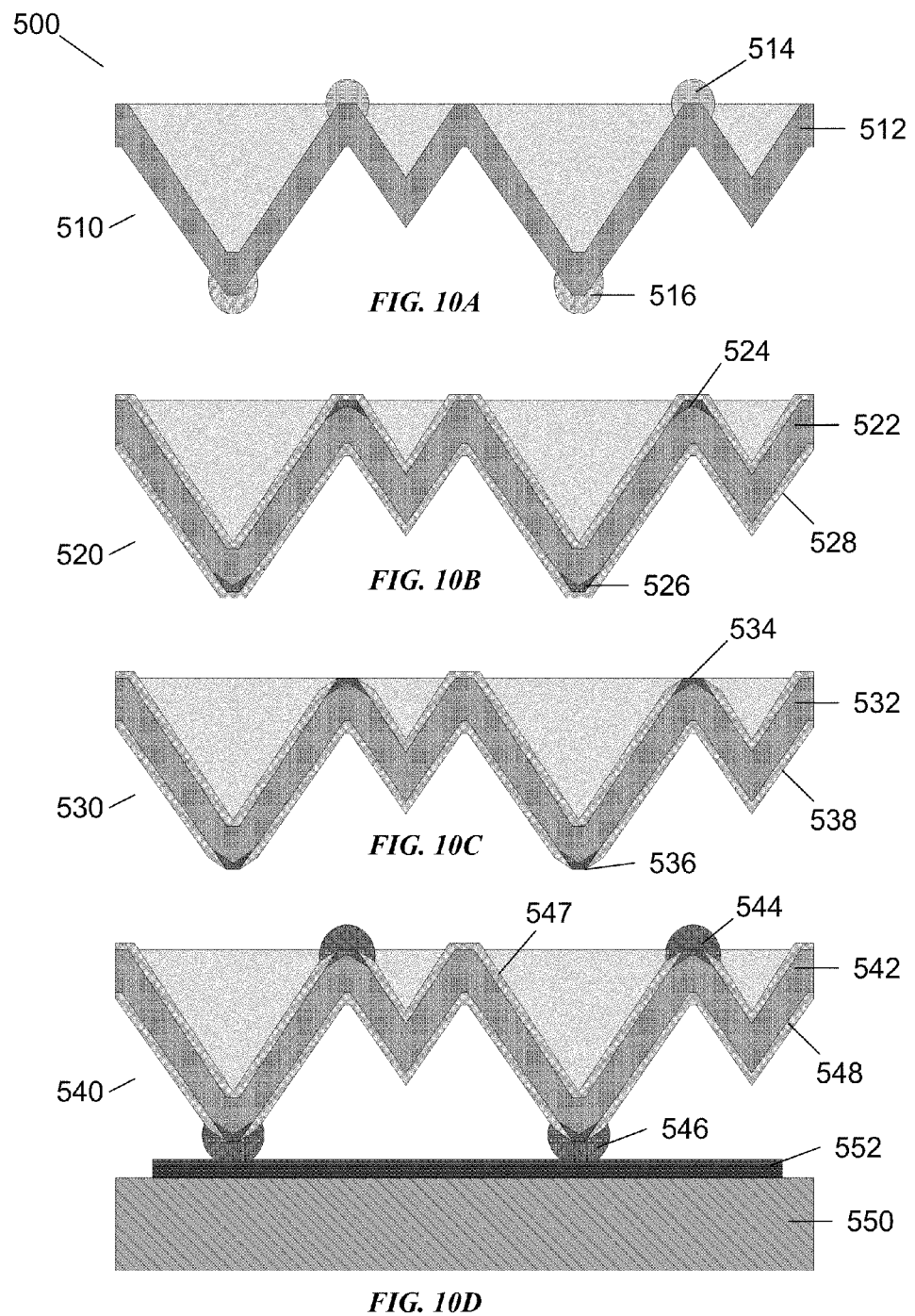

FIG. 10A illustrates 3-D TFSS 512 after the selective emitter 514 and base 516 coating steps. The liquid dopants, such as phosphorus-contained liquid for emitter and boron-contained liquid for base, are dried and cured after their selective coatings.

FIG. 10B illustrates 3-D TFSS 522 after the selective emitter 524 and base 526 diffusion and passivation layer 528 coating steps. The emitter and base diffusion regions are concurrently formed in a diffusion furnace with a controlled time and temperature. The actual doping profile may be extended towards to the sidewalls near the contact regions. After the emitter and base diffusion, the remaining dopant material and dielectric layers formed during the diffusion process are removed. A passivation layer is then applied on both the front and base surfaces of the 3-D TFSS. Examples of the passivation layer include thermally grown silicon dioxide and PECVD silicon nitride.

FIG. 10C illustrates 3-D TFSS 532 after the selective emitter 534 and base 536 contact openings are formed. The local openings on the emitter and base contact regions are made by selective passivation layer chemical etching, such as by applying HF-based etchant by inkjet dispensing. The contact openings are made smaller than the dopant diffused areas to avoid shunting after metallization. Portions of the top and bottom surface of the 3-D TFSS remain coated with passivation layer 538.

FIG. 10D illustrates a completed 3-D TFSS 542 after all the cell fabrication process disclosed in FIG. 9. The emitter metal 544 and base metal 546 are electroplated or electroless plated single or multilayer high-conductivity metallized regions (silver, aluminum, nickel, titanium, cobalt, or tantalum). Alternatively, the metal layer could be inkjet dispensed. The emitter metal contacts are formed in continuous metal lines, i.e. fingers and busbars on the 3-D TFSC top surface. However, because the base metal contacts have been formed on the inverted pyramidal apex regions on the backside of the 3-D TFSS, the base metal contacts are isolated regions. It is to be noted, the front surface passivation layer may also serve as the antireflection layer given a controlled thickness. In one embodiment, the 3-D TFSS after metallization is mounted on a supporting non-metal plate 550 with continuous metal surface or patterned metal lines 552 to form the base interconnects of the 3-D TFSC. Portions of the top and bottom surface of the 3-D TFSS remain coated with passivation layer 548.

The 3-D TFSS and cell process flows as shown is FIGS. 5, 6, 9 and 10 may be applied to substrate doping polarity of n-type for p-type selective emitters. Thus the 3-D TFSS base could be either n-type or p-type with corresponding emitter polarities.

The foregoing description of the preferred embodiments is provided to enable any person skilled in the art to make or use the claimed subject matter. Various modifications to these embodiments will be readily apparent to those skilled in the art, and the generic principles defined herein may be applied to other embodiments without the use of the innovative faculty. Thus, the claimed subject matter is not intended to be limited to the embodiments shown herein but is to be accorded the widest scope consistent with the principles and novel features disclosed herein.

What is claimed is:

1. A method for fabrication of a structure for use in a photovoltaic solar cell, the method comprising:
   selectively removing material from a monocrystalline silicon wafer to form a reusable monocrystalline silicon template having a top surface aligned along a (100) crystallographic plane of said template and a plurality of walls each aligned along a (111) crystallographic plane of said template, said walls defining a plurality of inverted pyramidal cavities comprising a set of larger inverted pyramidal cavities with an opening size in the range of approximately 10 µm up to 1 mm and a set of smaller inverted pyramidal cavities with an opening size a fraction of said opening size of said larger inverted pyramidal cavities, said set of larger pyramidal cavities and said set of smaller inverted pyramidal cavities arranged in a staggered pattern on said template which limits the length of ridges of said pyramidal cavity openings to less than twice the width of the openings of said larger pyramidal cavities;
   forming a substantially conformal sacrificial porous silicon layer comprising at least two different porosities coupled to said template; and
   epitaxially depositing a monocrystalline silicon layer to form a thin-film solar cell substrate on said sacrificial porous silicon layer, said solar cell substrate having a surface topography defined by said inverted pyramidal cavities on said reusable template;

said inverted pyramidal cavities on said reusable template ensuring that said solar cell substrate is capable of being detached from said template as a free-standing, self-supporting substrate with sufficient mechanical rigidity for use in a manufacturing environment.

2. The method of claim 1, wherein said step of selectively removing silicon material further comprises anisotropically etching the silicon template to form a plurality of walls each aligned along a (111) crystallographic plane of the silicon template wherein said walls form an inverted pyramidal cavity.

3. The method of claim 2, wherein said step of anisotropically etching the silicon template utilizes KOH or NaOH as an etchant.

4. The method of claim 2, wherein said step of anisotropically etching the silicon template utilizes TetraMethyl-Ammonium-Hydroxide (TMAH) as an etchant.

5. The method of claim 1, wherein said step of selectively removing silicon material further comprises:

forming a hard masking layer on the surface of the silicon template;

depositing a patterned soft masking layer on said hard masking layer on selected surface areas of the silicon substrate to be preserved as top surfaces;

etching said exposed hard masking layer;

removing said patterned soft masking layer exposing said hard masking layer underneath;

anisotropically etching exposed surfaces of the silicon template to form a plurality of walls each aligned along a (111) crystallographic plane of the silicon template wherein said walls form an inverted pyramidal cavity; and selectively removing the remaining patterned hard masking layer.

* * * * *